(12) United States Patent
Lee (10) Patent No.: US 9,711,586 B2
(45) Date of Patent: Jul. 18, 2017

(54) ORGANIC LIGHT-EMITTING DISPLAY APPARATUS AND METHOD OF MANUFACTURING THE SAME

(71) Applicant: Samsung Display Co., Ltd., Yongin (KR)

(72) Inventor: Wonkyu Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 14/812,839

(22) Filed: Jul. 29, 2015

(65) Prior Publication Data

US 2016/0181350 A1 Jun. 23, 2016

(30) Foreign Application Priority Data

Dec. 18, 2014 (KR) .......................... 10-2014-0183305

(51) Int. Cl.
*H01L 27/32* (2006.01)
*H01L 51/52* (2006.01)

(52) U.S. Cl.
CPC ...... *H01L 27/3279* (2013.01); *H01L 51/5212* (2013.01); *H01L 51/5228* (2013.01); *H01L 2251/5315* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS 7,701,132 B2 * 4/2010 Oh ...................... H01L 27/3276
257/72
2006/0113900 A1   6/2006 Oh
2010/0051178 A1 * 3/2010 Lee ...................... B32B 37/025
156/152

(Continued)

FOREIGN PATENT DOCUMENTS

JP    2010-108693   5/2010
JP    2011-040328   2/2011

(Continued)

OTHER PUBLICATIONS

Kashiwabara et al., "A Novel Auxiliary Cathode Technology for Large Area Top-emission AMOLED Displays", The 2nd Samsung Display Technology Symposium in 2013, p. 1-5.

*Primary Examiner* — Quoc Hoang
(74) *Attorney, Agent, or Firm* — H.C. Park & Associates, PLC (57) ABSTRACT

An organic light-emitting display apparatus includes a substrate, thin film transistors (TFTs), and organic light-emitting diode elements (OLEDs). First wirings have a first width and a first height and second wirings have a second width and a second height, in which the first wirings and the second wirings are formed in at least a portion of areas between the OLEDs. Third wirings connect the first wirings and the second wirings and have a third width smaller than the first width of the first wirings and the second width of the second wirings or have a third height smaller than the first height of the first wirings and the second height of the second wirings. An insulating layer covers at least a portion of the first and second wiring portions and exposes at least a portion of the third wirings.

20 Claims, 5 Drawing Sheets

(56) References Cited

U.S. PATENT DOCUMENTS

2010/0102335 A1    4/2010   Takagi et al.
2011/0241001 A1    10/2011   Omoto

FOREIGN PATENT DOCUMENTS

| KR | 10-2006-0059722 | 6/2006 |
| KR | 10-2010-0027526 | 3/2010 |
| KR | 10-2011-0130949 | 12/2011 |

\* cited by examiner

ORGANIC LIGHT-EMITTING DISPLAY APPARATUS AND METHOD OF MANUFACTURING THE SAME

CROSS-REFERENCE TO RELATED APPLICATION

This application claims priority from and the benefit of Korean Patent Application No. 10-2014-0183305, filed on Dec. 18, 2014, which is hereby incorporated by reference for all purposes as if fully set forth herein.

BACKGROUND

Field

Exemplary embodiments relate to an organic light-emitting display apparatus and a method of manufacturing the same.

Discussion of the Background

Organic light-emitting display devices can provide features such as a wide viewing angle, high contrast ratio, and rapid response time.

In general, organic light-emitting display devices can be manufactured by forming thin film transistors (TFTs) and organic light-emitting diode elements (OLEDs) on a substrate. The OLEDs are self-emitting units. Organic light-emitting display devices can be used as display units in small devices such as cellular phones or in large devices such as TVs.

Organic light-emitting display devices may include pixels (and sub-pixels), in which each pixel is an OLED including an intermediate layer that includes an emission layer (EML) and is disposed between a pixel electrode and an opposite electrode. The pixel may be controlled to emit light and adjust the light emission intensity thereof via a TFT that is electrically connected to the pixel electrode. The opposite electrode may be integrally formed with a plurality of pixels (sub-pixels).

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments may provide a large-sized organic light-emitting display device for displaying a high quality image by reducing IR drop in an integrally formed (e.g. being formed on an entire surface of a display area) opposite electrode.

Additional aspects will be set forth in the detailed description which follows, and, in part, will be apparent from the disclosure, or may be learned by practice of the inventive concept.

According to one or more exemplary embodiments, an organic light-emitting display apparatus includes a substrate, thin film transistors (TFTs) and organic light-emitting diode elements (OLEDs) on the substrate, the TFTs being electrically connected to the OLEDs, first wirings having a first width and a first height and second wirings having a second width and a second height, wherein the first wirings and the second wirings are formed in at least a portion of areas between the OLEDs, third wirings connecting the first wirings and the second wirings and having a third width smaller than the first width of the first wirings and the second width of the second wirings or having a third height smaller than the first height of the first wirings and the second height of the second wirings, and an insulating layer covering at least a portion of the first wirings and the second wirings and comprising openings that expose the third wirings.

According to one or more exemplary embodiments, an organic light-emitting display apparatus includes a substrate; a first thin film transistor (TFT) and a first organic light-emitting diode element (OLED) on the substrate, the first TFT being electrically connected to the first OLED; a second TFT and a second OLED on the substrate, the second TFT being electrically connected to the second OLED; a third TFT and a third OLED on the substrate, the third TFT being electrically connected to the third OLED; a first wiring having a first width and a first height, wherein the first wiring is disposed in at least a portion of an area between the first and second OLEDs; a second wiring having a second width and a second height, wherein the second wiring is disposed in at least a portion of an area between the second and third OLEDs; a third wiring connecting the first wiring and the second wiring and having at least one of (a) a third width smaller than the first width of the first wiring and the second width of the second wiring and (b) a third height smaller than the first height of the first wiring and the second height of the second wiring; and an insulating layer covering at least a portion of the first wiring and the second wiring and comprising an opening that exposes at least a portion of the third wiring.

According to one or more exemplary embodiments, a method of manufacturing an organic light-emitting display apparatus includes preparing a substrate, forming a plurality of pixel electrodes on the substrate, forming, in at least a portion of areas between the pixel electrodes, a plurality of first wirings having a first width and a first height and a plurality of second wirings having a second width and a second height, forming a plurality of third wirings that connect the first wirings and the second wirings and have a third width smaller than the first width of the first wirings and the second width of the second wirings or have a third height smaller than the first height of the first wirings and the second height of the second wirings, forming an insulating layer that have a plurality of first openings to expose a central portion of each of the pixel electrodes and a plurality of second openings to expose the third wirings, forming a common layer on an entire surface of the insulating layer and on the first, second openings, removing the common layer formed on the third wirings exposed through the second openings in the insulating layer by applying a voltage to the first and second wirings, and forming an opposite electrode on the common layer such that the opposite electrode directly contacts the third wirings exposed through the second openings of the insulating layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
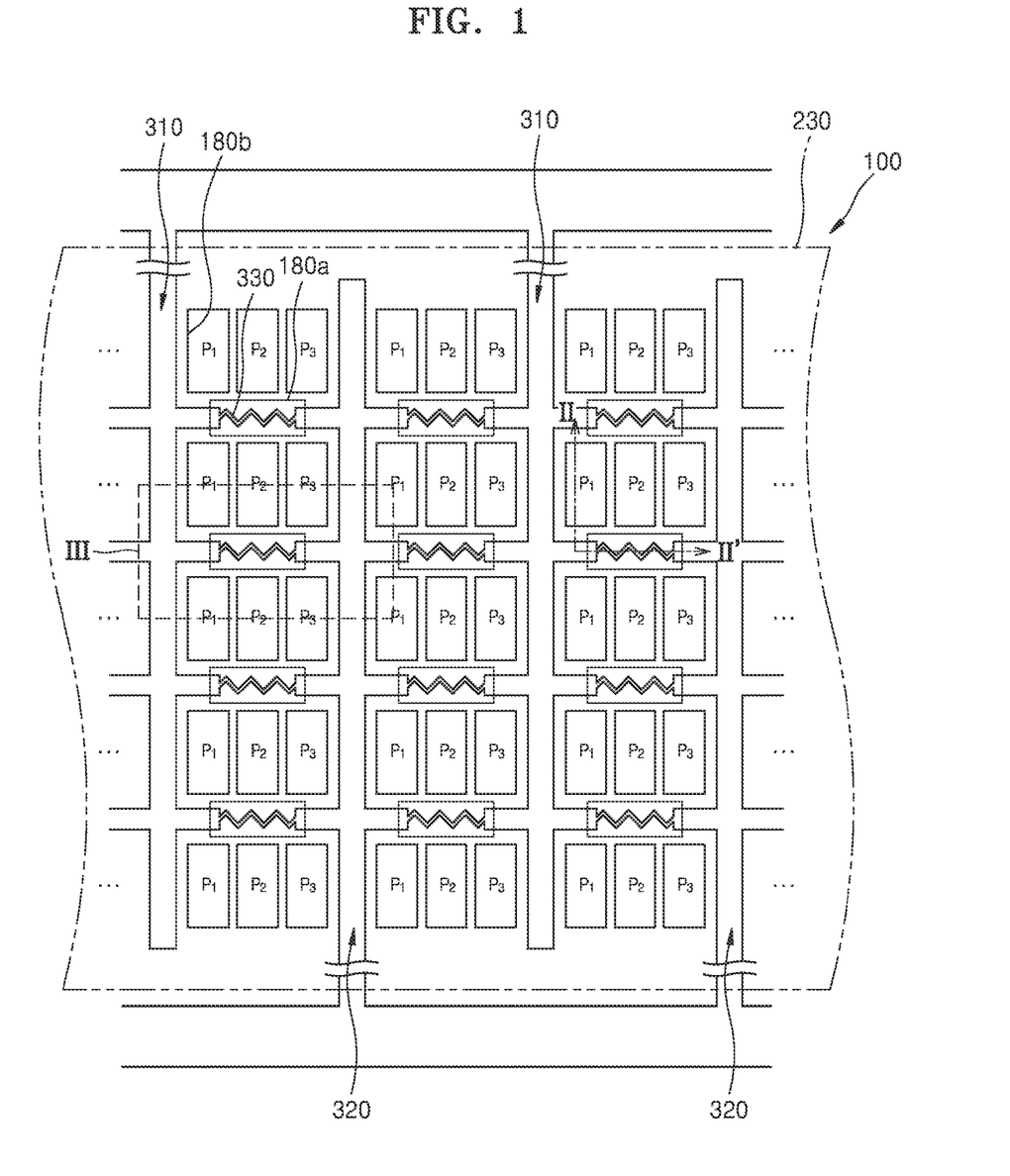
FIG. 1 is a plan view schematically illustrating an organic light-emitting display apparatus according to an exemplary embodiment.

FIG. 1 is a plan view schematically illustrating an organic light-emitting display apparatus according to an exemplary embodiment.

Referring to FIG. 1, the organic light-emitting display apparatus may include substrate 100, a plurality of thin film transistors (TFTs) on substrate 100, a plurality of organic light-emitting diode elements (OLEDs) (P1, P2, and P3) disposed on substrate 100 and connected to the plurality of TFTs, and an insulating layer that includes first wirings 310, second wirings 320, third wirings 330, and openings 180a between the plurality of OLEDs (P1, P2, and P3). An opposite electrode 230 may be formed on the insulating layer and on an entire surface of a display area of the organic light-emitting display apparatus. The display area is an area where an image is displayed, that is, an area other than edges of the organic light-emitting display apparatus where units such as controllers are located (non-display area).

The plurality of TFTs and the plurality of OLEDs (P1, P2, and P3) that are electrically connected to the plurality of TFTs may be disposed on the display area of the substrate 100. As shown in FIG. 1, each of the plurality of OLEDs may include a red sub-pixel P1, a green sub-pixel P2, and a blue sub-pixel P3. Each pixel unit of the organic light-emitting display apparatus according to the present embodiment includes the red sub-pixel P1, the green sub-pixel P2, and the blue sub-pixel P3. However, in other embodiments of the present inventive concept are not limited thereto, and the sub-pixels P1, P2, and P3 of the pixel unit may be arranged in other various colors, in a different order, and the numbers thereof may vary, for example.

First wirings 310 and second wirings 320 may be formed between at least a portion of areas between sets of the OLEDs (P1, P2, and P3). First wirings 310 and second wirings 320 may be power lines (ELVDD) for supplying current to the OLEDs, voltage (e.g. low level voltage) lines (ELVSS), or auxiliary wirings. Third wirings 330 may be provided between first and second wirings 310 and 320 and connect the first and second wirings 310 and 320. Third wirings 330 may have a smaller width than widths of first wirings 310 or widths of the second wirings 320.

According to a direction in which an image is displayed, the organic light-emitting display apparatus may be a top emission type apparatus that displays an image in a direction opposite to substrate 100, i.e., in a direction from substrate 100 to opposite electrode 230, or a bottom emission type apparatus that displays an image toward substrate 100. The top emission type apparatus may have a greater opening ratio than the bottom emission type apparatus. When opposite electrode 230 is a transparent electrode in order to display an image toward a top surface, such as an indium tin oxide (ITO) electrode, the transparent electrode may have a high resistance and an IR drop may occur. Alternatively, when low resistance metal, for example, silver (Ag) or magnesium (Mg), is used to form the opposite electrode 230, the opposite electrode 230 has to be very thin to increase light transmittance and the IR drop may also occur due to resistance. The occurrence of the IR drop has become a problem as a size of the opposite electrode 230 has increased along with the enlargement of the organic light-emitting display apparatus.

Therefore, in order to manufacture a large, top emission type apparatus and reduce the high resistance of opposite electrode 230, the organic light-emitting display apparatus according to an exemplary embodiment includes third wirings 330 connecting first and second wirings 310 and 320 arranged at least a portion of areas between sets of the OLEDs, and having openings 180a of the insulating layer that expose third wirings 330 and through which opposite electrode 230 contacts third wirings 330.

Figure 2:
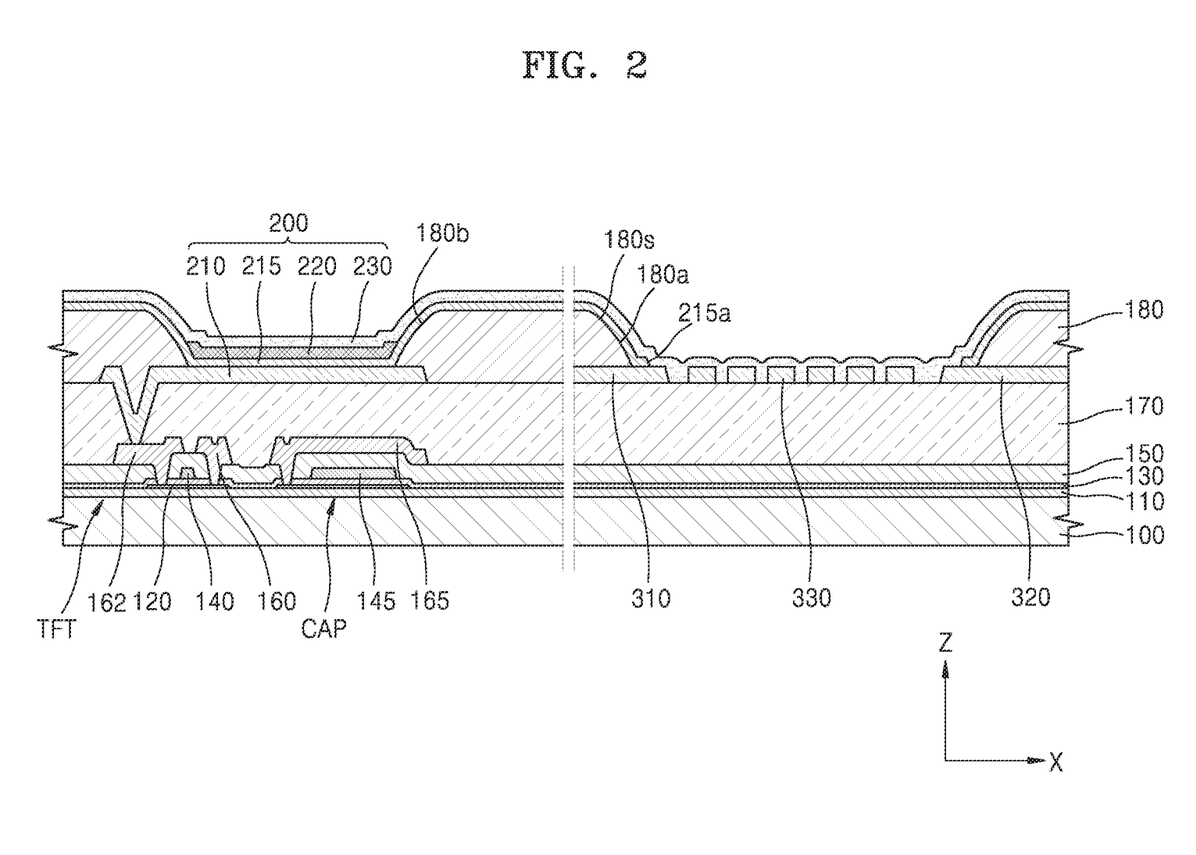
FIG. 2 is a cross-sectional view illustrating an organic light-emitting display apparatus cut along the lines II-II' of FIG. 1.
Figure 3:
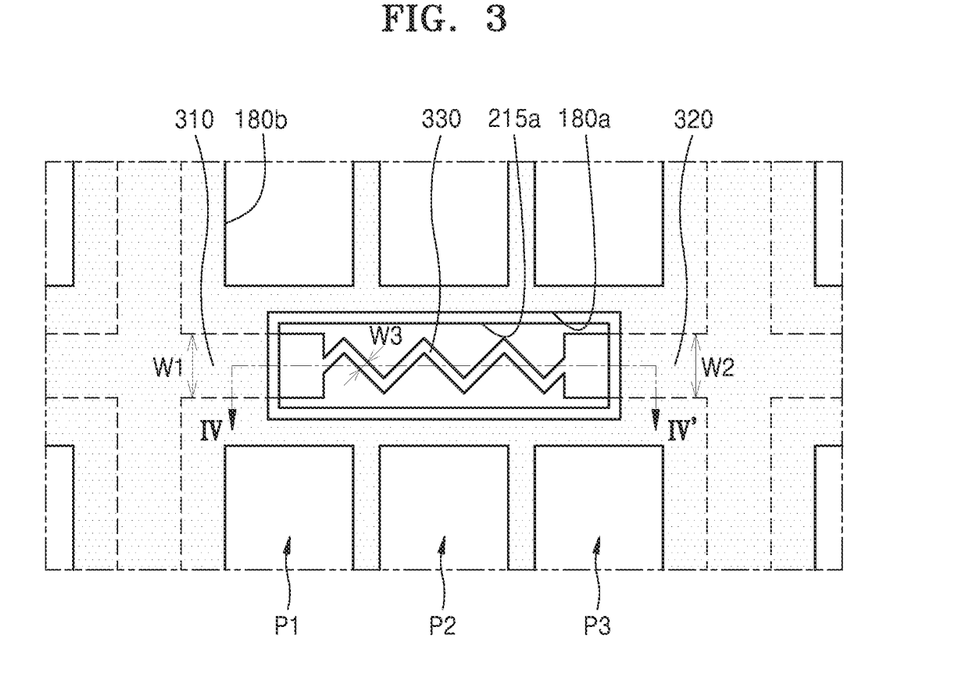
FIG. 3 is an enlarged plan view illustrating a portion III of the organic light-emitting display apparatus of FIG. 1.

FIG. 2 is a cross-sectional view illustrating the organic light-emitting display apparatus cut along the lines II-II' of FIG. 1. FIG. 3 is an enlarged plan view illustrating a portion III of the organic light-emitting display apparatus of FIG. 1.

Substrate 100 may be formed of various materials, e.g., a glass material, a metal material, or a plastic material, such as polyethylene terephthalate (PET), polyethylene naphthalate (PEN), or polyimide. Substrate 100 may have a display area where the plurality of OLEDs are formed and a peripheral area around the display area as a non-display area.

A TFT may be formed on substrate 100. The TFT includes semiconductor layer 120 that includes amorphous silicon, polycrystalline silicon, or an organic semiconductor material; gate electrode 140; source electrode 160; and drain electrode 162. A general structure of the TFT will be described in detail below.

Buffer layer 110, formed of silicon oxide or silicon nitride, for example, may be disposed on substrate 100, so as to planarize a surface of substrate 100 or to prevent impurities from penetrating into semiconductor layer 120. The semiconductor layer 120 may be disposed on the buffer layer 110.

Gate electrode 140 may be disposed on semiconductor layer 120, and source and drain electrodes 160 and 162 electrically communicate with one another via a signal applied to gate electrode 140. In consideration of adhesion of gate electrode 140 to an adjacent layer, flatness of a surface on which gate electrode 140 is to be stacked, and the processability of gate electrode 140, gate electrode 140 may be formed as a single layer or multiple layers. Gate electrode 140 may be formed of at least one material selected from, for example, aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

In order to insulate semiconductor layer 120 from gate electrode 140, gate insulating layer 130 formed of the silicon oxide and/or silicon nitride, for example, may be disposed between semiconductor layer 120 and gate electrode 140.

Interlayer insulating layer 150 may be disposed on gate electrode 140, and may be formed as a single layer or multiple layers formed of silicon oxide and/or silicon nitride, for example.

Source and drain electrodes 160 and 162 may be disposed on interlayer insulating layer 150. Source and drain electrodes 160 and 162 may be electrically connected to semiconductor layer 120 via contact holes formed in interlayer insulating layer 150 and gate insulating layer 130. Regarding the conductivity of source and drain electrodes 160 and 162, source and drain electrodes 160 and 162 may each be formed as a single layer or multiple layers. Each of source and drain electrodes 162 and 160 may be formed of at least one material selected from, for example, Al, Pt, Pd, Ag, Mg, Au, Ni, Nd, Ir, Cr, Li, Ca, Mo, Ti, W, and Cu.

Although not illustrated in the drawings, a protecting layer may be disposed to cover the TFT having the above-described structure. The protecting layer may be formed of an inorganic material, such as silicon oxide, silicon nitride, or silicon oxynitride.

Planarizing layer 170 may be disposed on the TFT. Planarizing layer 170 may be formed of, for example, an acryl-based organic material or benzocyclobutene (BCB). As illustrated in FIG. 2, buffer layer 110, gate insulating layer 130, interlayer insulating layer 150, and planarizing layer 170 may be formed across an entire surface of substrate 100.

Referring to FIG. 2, the TFT and OLED 200 that is electrically connected to the TFT may be disposed on substrate 100. OLED 200 may include pixel electrode 210, common layer 215, emission layer (EML) 220, and opposite electrode 230.

Pixel electrode 210 may be formed on planarizing layer 170 and may be electrically connected to drain electrode 162 via a contact hole formed in planarizing layer 170. Pixel electrode 210 may be a reflective electrode and include a reflective layer formed of one selected from Ag, Mg, Al, Pt, Pd, Au, Ni, Nd, Ir, Cr, and a combination thereof, and a layer formed of at least one selected from ITO, IZO, ZnO, and In$_2$O$_3$ on the reflective layer. Each sub-pixel of the pixel electrode 210 may be patterned.

First wiring 310, second wiring 320, and third wiring 330 may be disposed on planarizing layer 170. First and second wirings 310 and 320 may be power lines (ELVDD) for supplying current to OLED 200, voltage lines (ELVSS), or auxiliary wirings. Third wiring 330 may connect first and second wirings 310 and 320. Since first and second wirings 310 and 320 may be formed in an identical process, first and second wirings 310 and 320 may be formed on the same layer and include the same material. First and second wirings 310 and 320 may include the same material as pixel electrode 210 and be formed on the same layer as pixel electrode 210.

As shown in FIGS. 2 and 3, an end of first wiring 310 and an end of second wiring 320 may be spaced apart. In order to reduce a resistance deviation between first and second wirings 310 and 320, respective cross-sections of first and second wirings 310 and 320 may have the same size. Also, third wiring 330 may include the same material as first wiring 310, second wiring 320, and pixel electrode 210 and be formed on the same layer as first wiring 310, second wiring 320, and pixel electrode 210.

Insulating layer 180 may include first opening 180b that defines a pixel area and second opening 180a that exposes third wiring 330. An upper surface of pixel electrode 210 may be exposed via first opening 180b. Third wiring 330, an end of first wiring 310, and an end of second wiring 320 may be exposed via the second opening 180a. Insulating layer 180 may be formed as, for example, an organic insulating layer. The organic insulating layer may include one selected from acryl-based polymer (e.g., polymethylmethacrylate (PMMA)), polystyrene (PS), polymer derivatives having a phenol group, imide-based polymer, arylether-based polymer, amide-based polymer, fluorine-based polymer, p-xylene-based polymer, vinyl alcohol-based polymer, and a combination thereof.

Referring to FIG. 3, third wiring 330, which is exposed through second opening 180a of insulating layer 180, may have a zigzag shape or an "S" shape. First wiring 310 may have a first width W1, second wiring 320 may have a second width W2, and third wiring 330 may have a third width W3. First width W1 of first wiring 310 may be substantially equal to second width W2 of second wiring 320. Third width W3 of third wiring 330 may be smaller than first width W1 of first wiring 310 and second width W2 of second wiring 320, so that the resistance of third wiring 330 is relatively higher. Since resistance is inversely proportional to area and proportional to length, width of third wiring 330 may be reduced to increase the resistance so that a large amount of Joule heating is momentarily created. Thus, common layer 215 formed on third wiring 330 may be easily removed.

Common layer 215 is formed on pixel electrode 210 that is exposed through first opening 180b and insulating layer 180. Common layer 215 may include at least one selected from a hole transport layer (HTL), a hole injection layer (HIL), an electron transport layer (ETL), and an electron injection layer (EIL). Common layer 215 may be formed on an entire surface of the display area, unlike the EML 220. Although FIG. 2 illustrates that common layer 215 is formed first and then EML 220 is formed on the common layer 215, common layer 215 may be formed on EML 220.

Common layer 215 may include through hole 215a that is formed in an area corresponding to second opening 180a. Through hole 215a is an opening through which ends of first and second wirings 310 and 320 contact opposite electrode 230. An end of first wiring 310 and an end of second wiring 320, which face third wiring 330, may be exposed through through hole 215a. Since the end of first wiring 310 and the end of second wiring 320 are spaced apart, at least a portion of an upper surface of planarizing layer 170 between the respective ends of first and second wirings 310 and 320 may be exposed through through hole 215a. Similarly, the end of first wiring 310 and the end of second wiring 320 that face third wiring 330 may be exposed through second opening 180a of insulating layer 180.

Since through hole 215a and second opening 180a are formed in different processes, respective sizes of through hole 215a and second opening 180a may be different, as shown in FIGS. 2 and 3. For example, through hole 215a may be smaller than second opening 180a.

Since through hole 215a is formed by heat generated when voltage is applied to first and second wirings 310 and 320, common layer 215 on an etched surface 180s of insulating layer 180 may remain. That is, since through hole 215a is formed by removing a specific area of common layer 215 that corresponds to second opening 180a, an end of common layer 215 nearby through hole 215a may cover etched surface 180s of insulating layer 180. The forming process of through hole 215a will be described with reference to FIGS. 5 through 7.

EML 220 may be disposed on common layer 215. Unlike common layer 215, EML 220 may be formed on pixel electrode 210 that is exposed through first opening 180b of insulating layer 180. In other words, the HTL, the HIL, the ETL, and the EIL, which may be formed as common layer 215, may be integrally formed on the entire surface of substrate 100, and only EML 220 may be patterned and formed in each pixel.

EML 220 (emission layer or EML) may include a low molecular weight organic material or a polymer organic material. When EML 220 includes a low molecular weight organic material, common layer 215 may be disposed around EML 220. For example, the HTL, the HIL, the ETL, and the EIL may be stacked. Other various layers may be stacked if necessary. Copper phthalocyanine (CuPc), N'-Di (naphthalene-1-yl)-N, N'-diphenyl-benzidine (NPB), and tris-8-hydroxyquinoline aluminum (Alq$_3$), may be used as the low molecular weight organic material.

When EML 220 includes a polymer organic material, the HTL may be included as common layer 215, and EML 220 may be disposed on the HTL. The HTL may be formed of poly(3,4-ethylenedioxythiophene) (PEDOT) or polyaniline (PANI). Poly-phenylenevinylene (PPV)-based and polyfluorene-based polymer organic material may be used.

Opposite electrode 230 may be disposed on EML 220 and transmit light. Opposite electrode 230 may be formed of a transparent material, for example, ITO, IZO, ZnO, or In$_2$O$_3$. Opposite electrode 230 may contact an end of first wiring 310 and an end of second wiring 320 through through hole 215a. Also, opposite electrode 230 may contact upper surface of planarizing layer 170 which is exposed through through hole 215a between the respective ends of first and second wirings 310 and 320. As described above, since opposite electrode 230 contacts first and second wirings 310 and 320, which have a higher electrical conductivity than opposite electrode 230, opposite electrode 230 may prevent the occurrence of IR drop.

Figure 4:
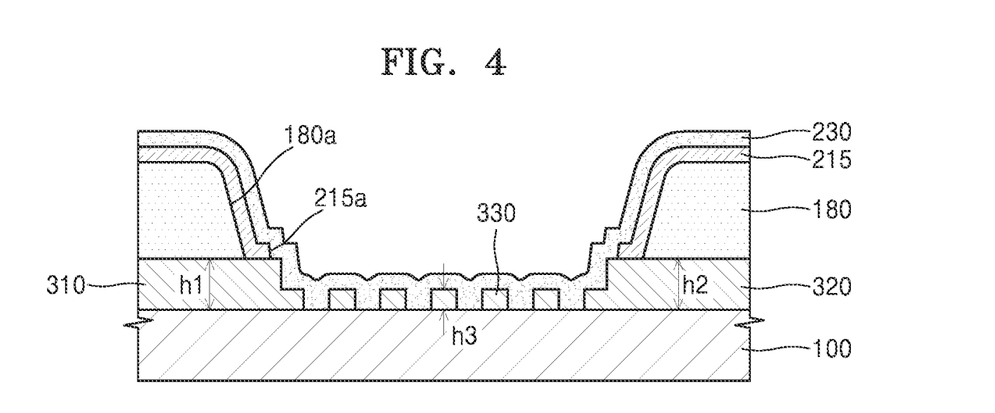
FIG. 4 is a cross-sectional view illustrating an organic light-emitting display apparatus cut along the lines IV-IV' of FIG. 3.

FIG. 4 is a cross-sectional view illustrating the organic light-emitting display apparatus cut along the lines IV-IV' of FIG. 3.

As described above, in order to increase the resistance of third wiring 330 so that a large amount of Joule heating is created, third width W3 of third wiring 330 may be smaller than first width W1 of first wiring 310 and second width W2 of second wiring 320, as shown in FIG. 3. At the same time, as shown in FIG. 4, third height h3 of third wiring 330 may be adjusted with third width W3 to increase the resistance of third wiring 330. First wiring 310 may have first height h1, second wiring 320 may have second height h2, and third wiring 330 may have third height h3. Third height h3 of third wiring 330 may be smaller than first height h1 of first wiring 310 and second height h2 of second wiring 320.

Accordingly, the resistance of third wiring 330 may be increased simultaneously with adjusting third width W3 and the third height h3 of third wiring 330. In addition, the resistance of third wiring 330 may be increased by reducing only third width W3 of third wiring 330 to be smaller than first and second widths W1 and W2 of the first and second wirings 310 and 320 or by reducing only third height h3 of third wiring 330 to be smaller than first and second heights h1 and h2 of first and second wirings 310 and 320.

Although the organic light-emitting display apparatus has been mainly described above, the exemplary embodiments are not limited thereto. A method of manufacturing the organic light-emitting display apparatus is also included in the scope of the exemplary embodiments.

Figure 5:
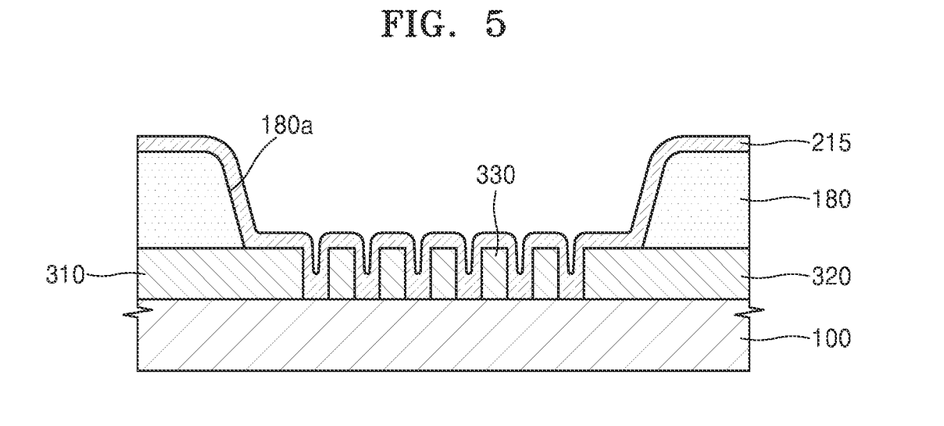
FIGS. 5 through 7 are cross-sectional view schematically illustrating a method of manufacturing an organic light-emitting display apparatus, according to an exemplary embodiment.
Figure 6:
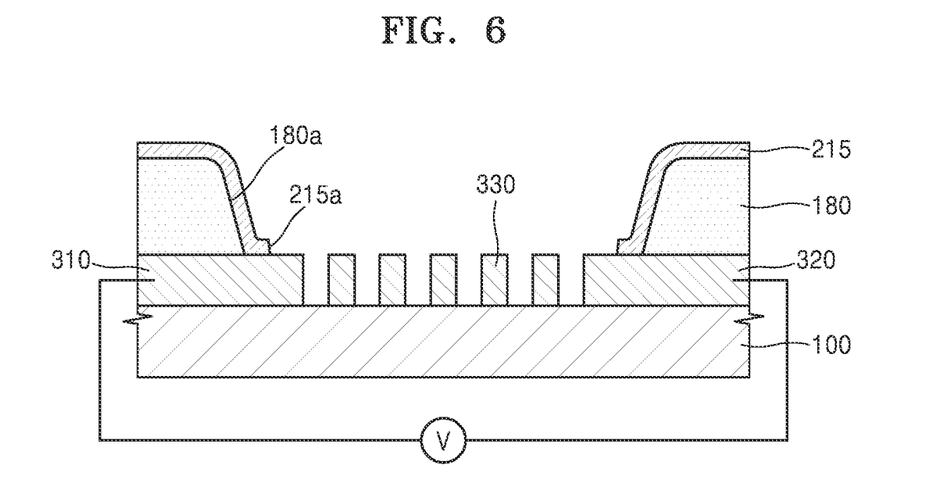
Figure 7:
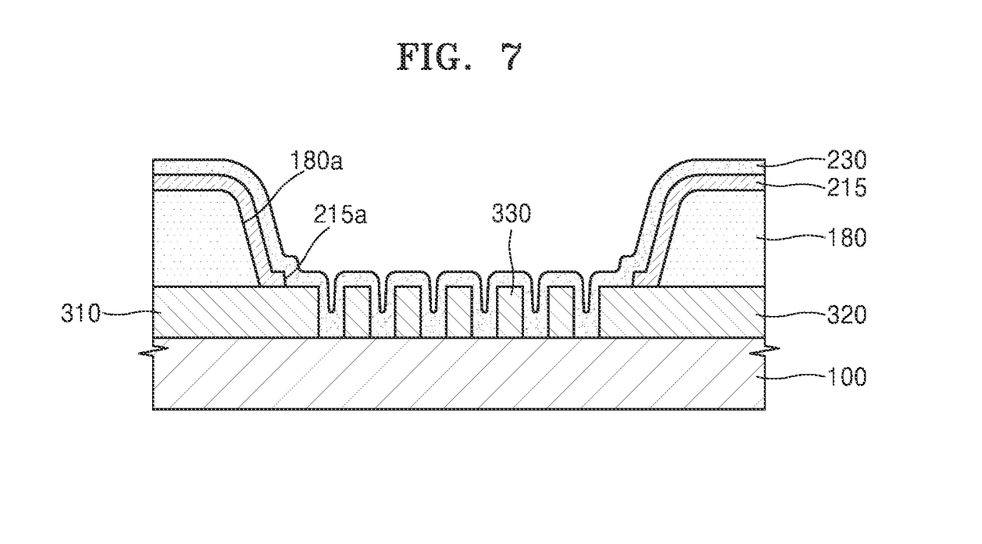

FIGS. 5 through 7 are cross-sectional views schematically illustrating a method of manufacturing the organic light-emitting display apparatus, according to an exemplary embodiment. FIGS. 5 to 7 illustrate an embodiment in which third height h3 of third wiring 330 is equal to first and second heights h1 and h2 of first and second wirings 310 and 320, and third width W3 of third wiring 330 is smaller than first and second widths W1 and W2 of first and second wirings 310 and 320.

FIG. 5 illustrates a process of, after forming the first to third wirings 310, 320, and 330, forming insulating layer 180 including second opening 180a that exposes the respective ends of first and second wirings 310 and 320 that face third wiring 330. For convenience of description, it is illustrated that first to third wirings 310, 320, and 330 are disposed on substrate 100 in FIGS. 5 through 7. However, various elements and wirings, such as a TFT or a capacitor, may be disposed between substrate 100 and first to third wirings 310, 320, and 330.

Insulating layer 180, which defines a pixel area, may be formed on first and second wirings 310 and 320. First opening 180b and second opening 180a may be formed in insulating layer 180. Although first opening 180b is not illustrated in FIGS. 5 through 7, referring to FIGS. 1 through 3, first opening 180b may be formed such that an upper surface of pixel electrode 210 is exposed to define each of the pixel areas of the display area. Second opening 180a may be formed such that the first and second wirings 310 and 320 are covered and third wiring 330 is exposed. Second opening 180a may be formed such that respective ends of first and second wirings 310 and 320 that face the third wiring 330 are exposed. As described above, second opening 180a may expose third wiring 330, and at least a portion of the upper surface of planarizing layer 170 on which third wiring 330 is formed.

Next, common layer 215 may be formed on the entire surface of the display area to cover insulating layer 180 and third wiring 330 that is exposed through second opening 180a of insulating layer 180. Common layer 215 has been described above.

Referring to FIG. 6, a voltage is applied to first and second wirings 310 and 320. Due to the voltage applied to first and second wirings 310 and 320, strong heat may be caused in third wiring 330 by Joule heating, and thus the common layer 215 formed on the third wiring 215 may be easily removed. After the portion of common layer 215 is removed, through hole 215a may be formed so that the respective ends of first and second wirings 310 and 320 that face the third wiring 330 are exposed.

Referring to FIG. 7, common layer 215, third wiring 330 exposed through through hole 215a that is formed by removing at least a portion of common layer 215, and opposite electrode 230, which covers the respective exposed ends of first and second wirings 310 and 320 that face third wiring 330, may be formed over the entire surface of the display area. Opposite electrode 230 may directly contact third wiring 330 through through hole 215a that is formed by removing at least a portion of common layer 215. As described above, since opposite electrode 230 contacts first and second wirings 310 and 320, which have a higher electrical conductivity than opposite electrode 230, opposite electrode 230 may prevent the occurrence of an IR drop.

Figure 8:
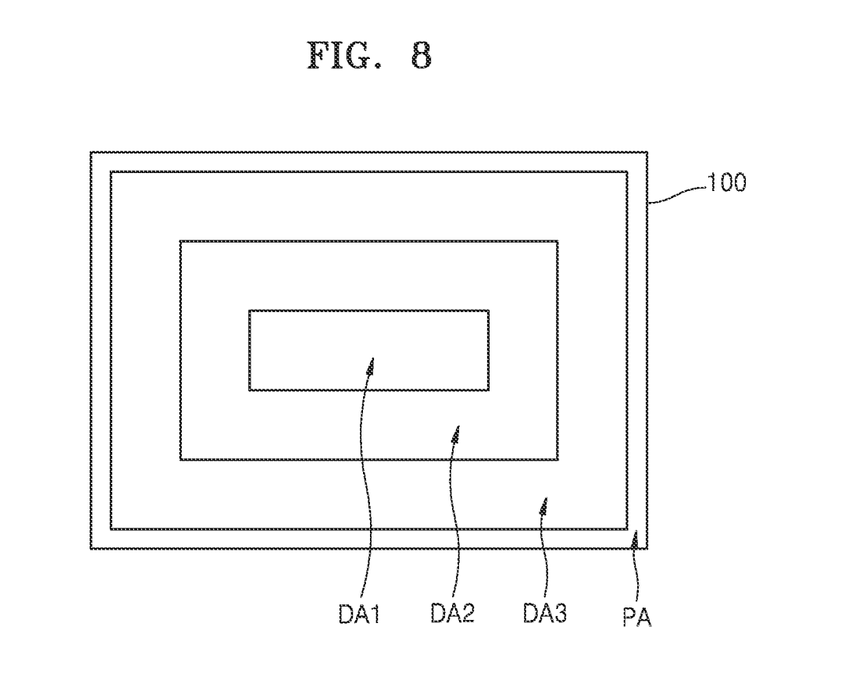
FIG. 8 is a plan view schematically illustrating a display area of the organic light-emitting display apparatus according to an exemplary embodiment.

FIG. 8 is a plan view schematically illustrating the display area of the organic light-emitting display apparatus according to an exemplary embodiment.

Referring to FIG. 8, substrate 100 may include display areas (DA1, DA2, and DA3), in which pixel units are disposed, and a peripheral area PA that surrounds the display areas (DA1, DA2, and DA3) as a non-display area. The display areas may be respectively referred to as first area DA1 in the center of substrate 100, second area DA2 that surrounds first area DA1, and third area DA3 that surrounds second area DA2. The number of second openings 180a formed in first area DA1 per unit area may be larger than the number of second openings 180a formed in second area DA2 per unit area, and the number of second openings 180a formed in second area DA2 per unit area may be larger than the number of second openings 180a formed in third area DA3 per unit area. Accordingly, when opposite electrode 230 is formed in one body on substrate 100 that is large and electric power is supplied from an upper portion and a lower portion of a panel toward a central portion, an IR drop due to a resistance increase occurs mostly in the central portion of the panel. Therefore, second openings 180a may be densely formed in the central portion of the panel where the IR drop mostly occurs and less densely formed toward outer edges so that the occurrence of the IR drop is prevented in opposite electrode 230 and brightness of the panel is improved.

As described above, according to the one or more of the above exemplary embodiments, a large organic light-emitting display apparatus capable of display high quality images and a method of manufacturing the same are described. However, the scope of the exemplary embodiments is not limited thereto.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display apparatus comprising:

a substrate;
thin film transistors (TFTs) and organic light-emitting diode elements (OLEDs) on the substrate, the TFTs being electrically connected to the OLEDs;
first wirings having a first width and a first height and second wirings having a second width and a second height, wherein the first wirings and the second wirings are formed in at least a portion of areas between the OLEDs;
third wirings connecting the first wirings and the second wirings and having a third width smaller than the first width of the first wirings and the second width of the second wirings or having a third height smaller than the first height of the first wirings and the second height of the second wirings; and
an insulating layer covering at least a portion of the first wirings and the second wirings and comprising openings that expose the third wirings.

2. The apparatus of claim 1, wherein each of the third wirings comprises a zigzag shape or an "S" shape.

3. The apparatus of claim 2, wherein the OLEDs comprise:
pixel electrodes;
emission layers patterned corresponding to the pixel electrodes and formed on the pixel electrodes;
an opposite electrode facing the pixel electrodes; and
a common layer between the pixel electrodes and the opposite electrode and formed in one body on the pixel electrodes,
wherein the common layer comprises through holes that correspond to the area including the third wirings exposed by the openings.

4. The apparatus of claim 3, wherein the third wirings exposed by the openings directly contact the opposite electrode.

5. The apparatus of claim 3, wherein the first wirings, the second wirings, the third wirings, and the pixel electrodes comprise the same material and are formed on the same layer.

6. The apparatus of claim 3, wherein the openings in the insulating layer expose respective ends of the first and second wirings which face the third wirings.

7. The apparatus of claim 3, wherein the through holes in the common layer expose respective ends of the first and second wirings which face the third wirings.

8. The apparatus of claim 1, wherein the third width of the third wirings is smaller than the first width of the first wirings and the second width of the second wirings, and the third height of the third wirings is smaller than the first height of the first wirings and the second height of the second wirings.

9. The apparatus of claim 1, wherein the substrate comprises a first area in a center of the substrate, a second area that surrounds the first area, and a third area that surrounds the second area, and
the number of openings formed in the first area per unit area is the largest among the all areas.

10. The apparatus of claim 9, wherein the number of openings disposed in the first area per unit area is larger than the number of openings disposed in the second area per unit area, and the number of openings disposed in the second area per unit area is larger than the number of second openings disposed in the third area per unit area.

11. An organic light-emitting display apparatus comprising:
a substrate;
a first thin film transistor (TFT) and a first organic light-emitting diode element (OLED) on the substrate, the first TFT being electrically connected to the first OLED;
a second TFT and a second OLED on the substrate, the second TFT being electrically connected to the second OLED;
a third TFT and a third OLED on the substrate, the third TFT being electrically connected to the third OLED;
a first wiring having a first width and a first height, wherein the first wiring is disposed in at least a portion of an area between the first and second OLEDs;
a second wiring having a second width and a second height, wherein the second wiring is disposed in at least a portion of an area between the second and third OLEDs;
a third wiring connecting the first wiring and the second wiring and having at least one of (a) a third width smaller than the first width of the first wiring and the second width of the second wiring and (b) a third height smaller than the first height of the first wiring and the second height of the second wiring; and
an insulating layer covering at least a portion of the first wiring and the second wiring and comprising an opening that exposes at least a portion of the third wiring.

12. A method of manufacturing an organic light-emitting display apparatus, the method comprising:
preparing a substrate;
forming pixel electrodes on the substrate;
forming first wirings between at least a portion of the pixel electrodes, the first wirings having a first width and a first height;
forming second wirings between at least a portion of the pixel electrodes and between at least a portion of the first wirings, the second wirings having a second width and a second height;
forming third wirings connecting respective first and second wirings and having at least one of (a) a third width smaller than the first width of the respective first wiring and the second width of the respective second wiring and (b) a third height smaller than the first height of the respective first wiring and the second height of the respective second wiring;
forming an insulating layer comprising first openings to expose at least a central portion of respective pixel electrodes and second openings to expose at least a portion of the third wirings;
forming a common layer across the surface of the insulating layer and on the exposed portions of the pixel electrodes in the first openings and the exposed portions of the third wirings in the second openings;
removing portions of the common layer disposed on the exposed portions of the third wirings in the second openings by applying a voltage to the first and second wirings; and
forming an opposite electrode on the common layer such that the opposite electrode directly contacts the exposed portions of the third wirings.

13. The method of claim 12, wherein the insulating layer covers the pixel electrodes such that central portions of the pixel electrodes are exposed.

14. The method of claim 12, wherein the insulating layer covers at least a portion of the first wirings and the second wirings.

15. The method of claim 12, wherein the third wirings comprise a zigzag shape or an "S" shape.

16. The method of claim 12, further comprising the step of patterning emission layers on the pixel electrodes, which are exposed through the first openings in the insulating layer, such that the emission layers correspond to the pixel electrodes.

17. The method of claim 12, wherein the third wirings have the third width smaller than the first width of the respective first wirings and the second width of the respective second wirings, and have the third height smaller than the first height of the respective first wirings and the second height of the respective second wirings.

18. The method of claim 12, wherein the steps of the forming of the pixel electrodes, the forming of the first and second wirings, and the forming of the third wirings are simultaneously executed.

19. The method of claim 12, wherein the substrate comprises a first area in a center of the substrate, a second area that surrounds the first area, and a third area that surrounds the second area, and the number of the second openings disposed in the first area per unit area is the largest among the first, second, and third areas.

20. The method of claim 19, wherein the number of second openings disposed in the first area per unit area is larger than the number of second openings disposed in the second area per unit area, and the number of second openings disposed in the second area per unit area is larger than the number of second openings disposed in the third area per unit area.

* * * * *